(12) United States Patent
Deng et al.

(10) Patent No.: US 6,930,497 B2
(45) Date of Patent: Aug. 16, 2005

(54) FLEXIBLE MULTI-LAYERED PROBE FOR MEASURING A SIGNAL FROM AN OBJECT

(75) Inventors: Joseph D. S. Deng, Taoyuan (TW); Hong-Chyi Lee, Taotuan Hsien (TW)

(73) Assignee: Chung Shan Institute of Science and Technology Armaments Bureau, M.N.D., Taoyuan (TW)

( * ) Notice: Subject to any disclaimer, the term of this patent is extended or adjusted under 35 U.S.C. 154(b) by 0 days.

(21) Appl. No.: 10/818,958

(22) Filed: Apr. 5, 2004

(65) Prior Publication Data

US 2004/0189334 A1 Sep. 30, 2004

Related U.S. Application Data

(63) Continuation-in-part of application No. 10/033,749, filed on Dec. 19, 2001, now Pat. No. 6,759,859.

(51) Int. Cl.$^7$ ............................................. G01R 31/02
(52) U.S. Cl. ..................................... 324/754; 324/72.5
(58) Field of Search ............................... 324/754–762, 324/765, 72.5, 537; 438/14–18, 482, 824; 333/246–248

(56) References Cited

U.S. PATENT DOCUMENTS

| | | | | |
|---|---|---|---|---|
| 3,596,228 A | * | 7/1971 | Reed et al. ................. | 324/537 |
| 4,697,143 A | * | 9/1987 | Lockwood et al. ......... | 324/754 |
| 4,853,627 A | * | 8/1989 | Gleason et al. ............. | 324/754 |
| 4,894,612 A | * | 1/1990 | Drake et al. ................ | 324/754 |
| 4,998,062 A | * | 3/1991 | Ikeda ......................... | 324/754 |
| 5,003,253 A | * | 3/1991 | Majidi-Ahy et al. ........ | 324/754 |
| 5,012,186 A | * | 4/1991 | Gleason ...................... | 324/762 |
| 5,231,349 A | * | 7/1993 | Majidi-Ahy et al. ........ | 324/754 |
| 5,373,231 A | * | 12/1994 | Boll et al. ................... | 324/537 |
| 5,506,515 A | * | 4/1996 | Godshalk et al. ........... | 324/762 |
| 5,565,788 A | * | 10/1996 | Burr et al. ................... | 324/762 |
| 6,174,744 B1 | * | 1/2001 | Watanabe et al. ........... | 324/754 |
| 6,759,859 B2 | * | 7/2004 | Deng et al. .................. | 324/754 |

OTHER PUBLICATIONS

"Rugged Probe Design Delivers MIC Measurements", Markuu Jenu/ Microwaves & RF/ Jenu/ Microwaves & RF/ Jun. 1996/ p. 104–106.
"Kapton"

* cited by examiner

Primary Examiner—Jermele M. Hollington
(74) Attorney, Agent, or Firm—J.C Patents

(57) ABSTRACT

A flexible probe, applicable for measuring signals from the object with an uneven surface, includes at least a probe tip, a flexible multi-layered dielectric substrate, a planar transmission structure and a coaxial transmission structure. The probe tip is connected to the planar transmission structure and extends beyond the flexible dielectric substrate. The planar transmission structure is attached to and supported by the flexible dielectric substrate and then connected to the coaxial transmission structure.

20 Claims, 9 Drawing Sheets

FLEXIBLE MULTI-LAYERED PROBE FOR MEASURING A SIGNAL FROM AN OBJECT

CROSS-REFERENCE TO RELATED APPLICATION

This application is a continuation-in-part of prior application Ser. No. 10/033,749, filed on Dec. 19, 2001 now U.S. Pat. No. 6,759,859.

BACKGROUND OF THE INVENTION

1. Field of the Invention

The invention relates in general to a probe, and more particularly, to a flexible probe used to measure microwave and high-speed signals from an uneven surface.

2. Description of the Related Art

In addition to the printed circuit board (PCB), the versatile applications of microwave and high-speed signal circuit further include the hybrid circuit, the multi-chip module (MCM), and the integrated circuit (IC). For the microwave circuit and the high-speed signal circuit, the most accurate and convenient measurement methods include on-wafer measurement. To obtain an accurate measurement result, a good probe is required.

The technique of probe used for on-wafer measurement has been disclosed in U.S. Pat. No. 4,697,143 in September 1989. This invention of "Wafer Probe" issued to Larry R. Lockwood et al. is a probe made with $Al_2O_3$ substrate for signal measurement. The measured signal from the tip is transmitted through the transmission line on the substrate to a planar-coaxial cable converter, and is then output to a measurement instrument. In U.S. Pat. No. 4,697,143, the microwave probe has a planar probing structure that is fabricated on the hard $Al_2O_3$ substrate for signal transmission. Such structure is used to probe the object to be measured. In addition to a probe tip, the signal is transmitted through the probe tip, along a signal transmission planar structure on the $Al_2O_3$ substrate to the coaxial transmission structure. The signal transmission medium made of $Al_2O_3$ has the characteristics of high microwave transmission quality and low transmission loss. However, as the supporting substrate is made of a hard material, the contact angle between the probe and the object to be measured needs to be fixed and the downward pressure applied to the probe is strictly specified during measurement. Therefore, the probe tip has to be held parallel to the object to be measured. Further, only a limited range of pressure can be applied to the probe while touching the object, for avoiding damaging the probe.

Later in April 1996, Edward M. Godshalk disclosed "high-frequency probe tip assembly" in the U.S. Pat. No. 5,506,515. One end of the planar transmission structure, which is void of supporting substrate and is in a claw shape, is used as the probe tip, so as to allow measuring a non-planar object. A planar-coaxial converter is adjacent right behind the probe to output the signal to the measurement instrument thereby. In U.S. Pat. No. 5,506,515, the claw-shaped probe tip can be shifted up and down within a limited range for measuring an object with an uneven or non-planar surface. The problems relating to the contact angle and the downward pressure are thus partially resolved. However, because only the claw-shaped probe tip has flexibility, the tolerance of the contact angle for probing the object is still limited by the length and pitch of the probe tip. That is, the longer the probe tip is and the smaller the pitch is, the bigger is the tolerance of the angle.

Further in June 1996, Markku Jenu disclosed "rugged probe design MIC measurement" in the Microwave & RF (Radio Frequency) magazine. A soft substrate is incorporated as the supporting material for the probe tip and the signal transmission planar structure. Such substrate allows the probe tip having angle differences (for example, angle of depression or angle of elevation) with the object to be measured. In this disclosure, different material layers (with different dielectric constants) are laminated into a composite substrate, of which one layer with a higher dielectric constant is harder and used as the dielectric material for signal transmission planar structure, and another layer with a lower dielectric constant is softer and provides supports and flexibility. However, the probe tip and the signal transmission planar structure are all disposed on the composite substrate. As the whole structure of the probe is resilient, the angle tolerance of the probe tip for measuring the object is increased. However, being formed on the composite substrate, the probe tip moves along with the composite substrate, rather than moving up and down separately. Thus, this kind of probe is not applicable for measuring the object with an uneven surface.

SUMMARY OF THE INVENTION

The invention provides a flexible probe. A flexible high-frequency substrate and a claw-shape probe tip that extends beyond the substrate are incorporated to resolve the problems due to unevenness of the circuit substrate and poor surrounding planarity. The accuracy and reproducibility for measurement can thus be ensured.

The invention provides a flexible probe to measure on-wafer signals. The probe has a metal probe tip, a flexible multi-layered dielectric substrate, a planar transmission structure and a fixed end. The probe tip is connected to the planar transmission structure and the planar transmission structure is connected to the fixed end. The planar transmission structure is attached to and supported by the flexible multi-layered dielectric substrate.

In one embodiment of the invention, the metal probe tip is used to probe the signals on wafer. Further, the metal tip is able to rotate about an axis with a specific angle and to lift or dive as required.

In another embodiment of the invention, the fixed end supports and holds the probe, and is used as a transmission structure converter of the probe to connect the planar transmission structure to the coaxial transmission structure.

This invention further provides a flexible probe for board level measurement. The probe has a probe tip, a planar transmission structure and a multi-layered dielectric material substrate. The probe tip is connected to the planar transmission structure. The multi-layered dielectric material substrate supports the planar transmission structure. Devices and circuits can be embedded within the multi-layered dielectric material substrate.

In a further embodiment of the invention, the probe tip is protrusive to probe the signal of the board. In addition, the metal probe tip can rotate around an axis with a specific angle and can dive and lift.

The invention further provides a flexible probe to measure signals for board level measurement. The probe has a probe tip, a connector and a multi-layered dielectric material. The connector is connected to the probe tip and transmits the signals from the probe tip to the measurement instruments. The multi-layered dielectric material supports the planar transmission structure. Devices and circuits can be embedded into the multi-layered dielectric material.

Accordingly, the probe provided by the invention can be bent or twisted to a configuration conformal to the measuring object. Due to the flexibility of the substrate, the probe can apply pressure within a broader range to the probe tip. The probe of this invention provides the advantages of high measurement repeatability, operation convenience and durability.

Both the foregoing general description and the following detailed description are exemplary and explanatory only and are not restrictive of the invention, as claimed.

DESCRIPTION OF THE PREFERRED EMBODIMENTS

Figure 1A:
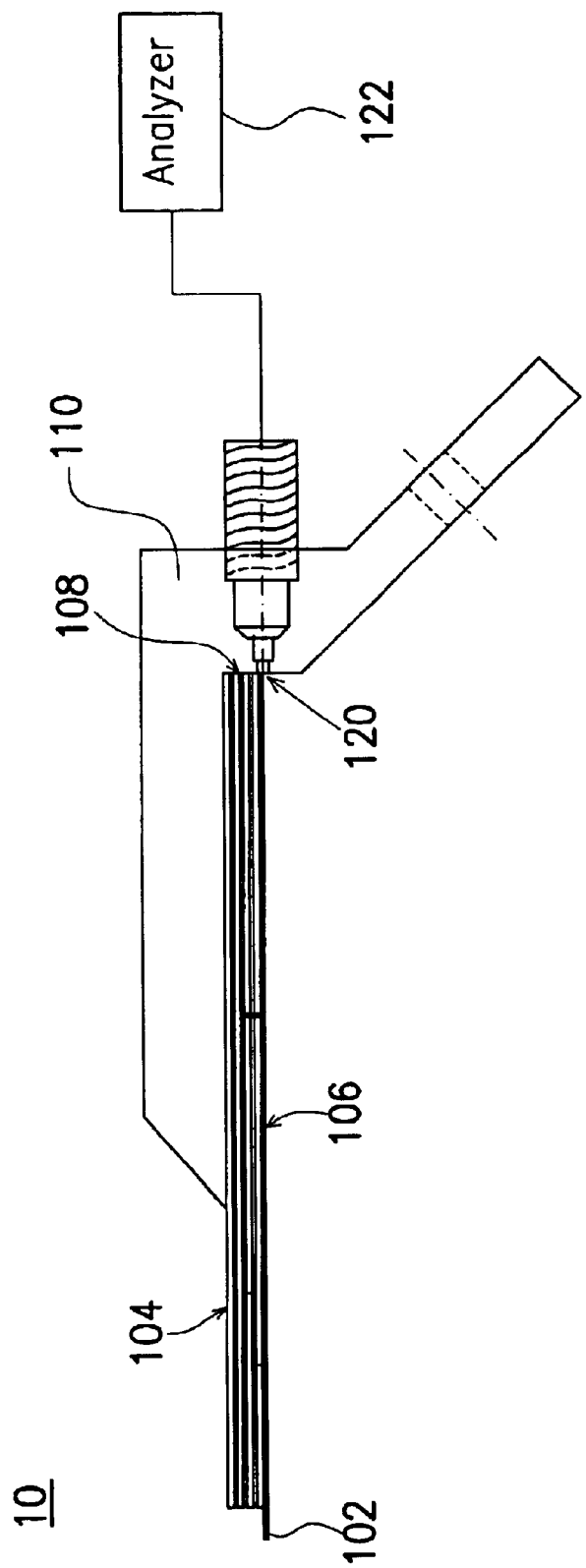
FIG. 1A is a schematic side view of a flexible probe according to one preferred embodiment of the present invention.
Figure 1B:
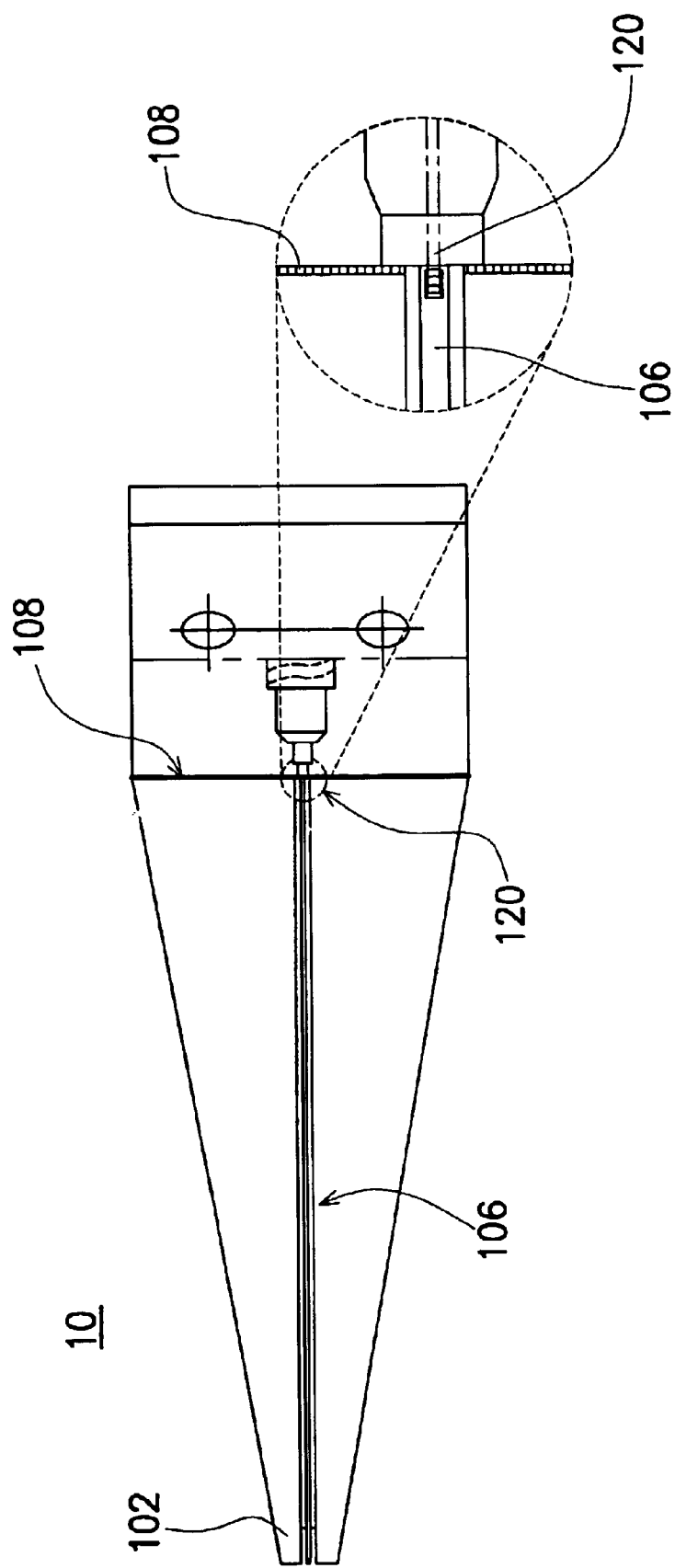
FIG. 1B is a schematic bottom view of the flexible probe according to one preferred embodiment of the present invention.

Referring to FIGS. 1A–1B, the structure of a flexible probe according to one preferred embodiment of the present invention is shown. The probe 10 can be used to measure the signals, for example, microwave signals, on wafer or in the board level measurement. In FIG. 1A, the probe 10 includes a probe tip 102, a flexible multi-layered dielectric substrate 104, a planar transmission structure 106, and a fixed end 108 for supporting the probe 10. The probe tip 102 is connected to the planar transmission structure 106, while the planar transmission structure 106 is attached to a surface of the dielectric substrate 104 and supported by the dielectric substrate 104. Preferably, the probe tip is made of a metal material and has a claw shape. The probe tip 102 extends outward and outthrusts from the planar transmission structure into the surrounding air. That is, the probe tip 102 is not in direct contact with the dielectric substrate 104. The probe tip 102 can move up and down and rotate within a limited range to measure the signal, from the object with an uneven surface or a non-planar object.

The flexible dielectric substrate 104 has a Young's modulus of about 1–10 GPa. Preferably, the flexible dielectric substrate 104 has a Young's modulus of about 2–5 GPa. For example, the material on the dielectric substrate 104 can be polyimide or polymers of aromatic dianhydrides and aromatic diamines, having a Young's modulus equivalent to or less than 10 GPa. For example, the planar transmission structure 106 is a circuit line or a transmission line, such as, CPW. Preferably, the probe tip 102 and the planar transmission structure 106 are integral and made from the same metal lines. In other words, terminals of the metal lines of the planar transmission structure may extend beyond the dielectric substrate, and become the claws (i.e. the probe tip). The fixed end 108 is connected to the multi-layered dielectric substrate 104 and the planar transmission structure 106 to support the probe 10 and hold the probe 10 to a mounting block 110, and functions as the probe structural transition for connection between the planar transmission structure 106 and the coaxial transmission structure 120. The signal measured by the probe tip 102 is transmitted through the planar transmission structure 106 to the coaxial transmission structure 120. As shown in FIG. 1B, the coaxial transmission structure 120 is clearly illustrated from the bottom view of the probe 10 and an expanded display view of the coaxial transmission structure 120 is shown on the right side. The coaxial transmission structure 120 is further electrically connected to a network analyzer 122 (and/or a power meter or a detector) for reading and outputting the measured signal.

Figure 2A:
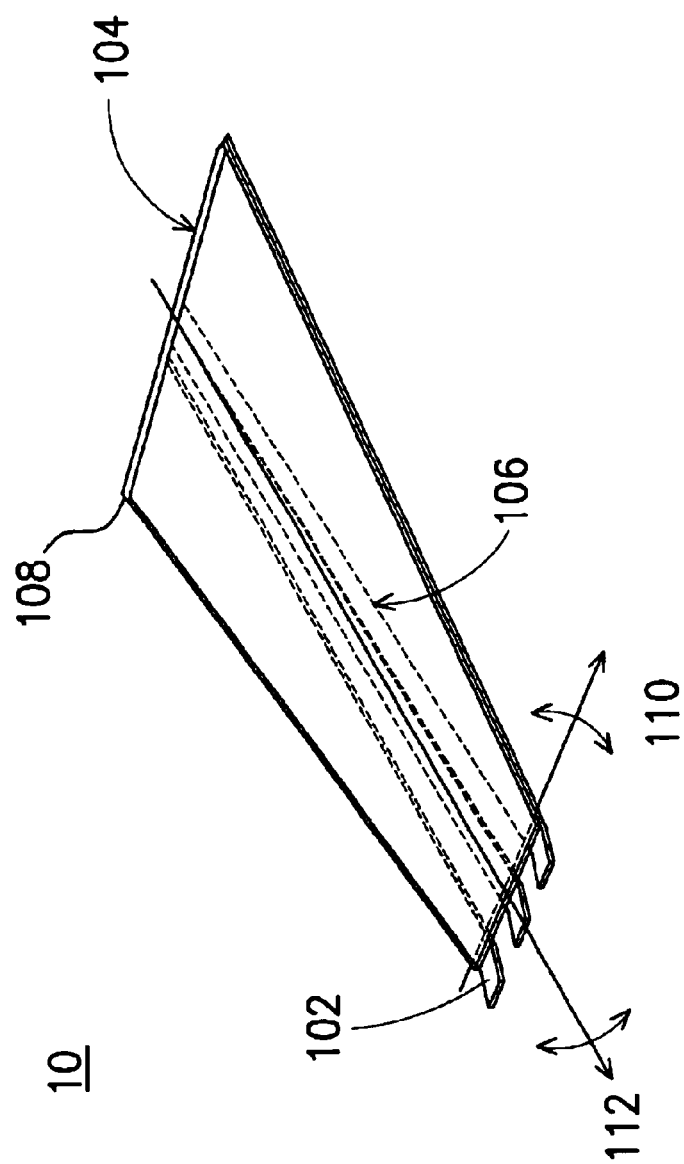
FIG. 2A is a schematic view showing movements of the flexible probe.
Figure 2B:
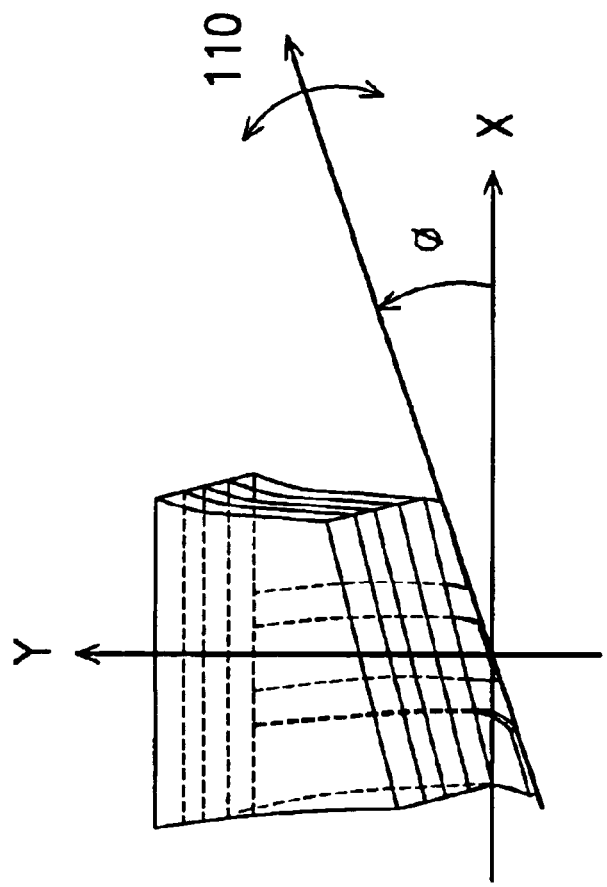
FIG. 2B shows the configuration conformity of the flexible probe by movements of rotation.
Figure 2C:
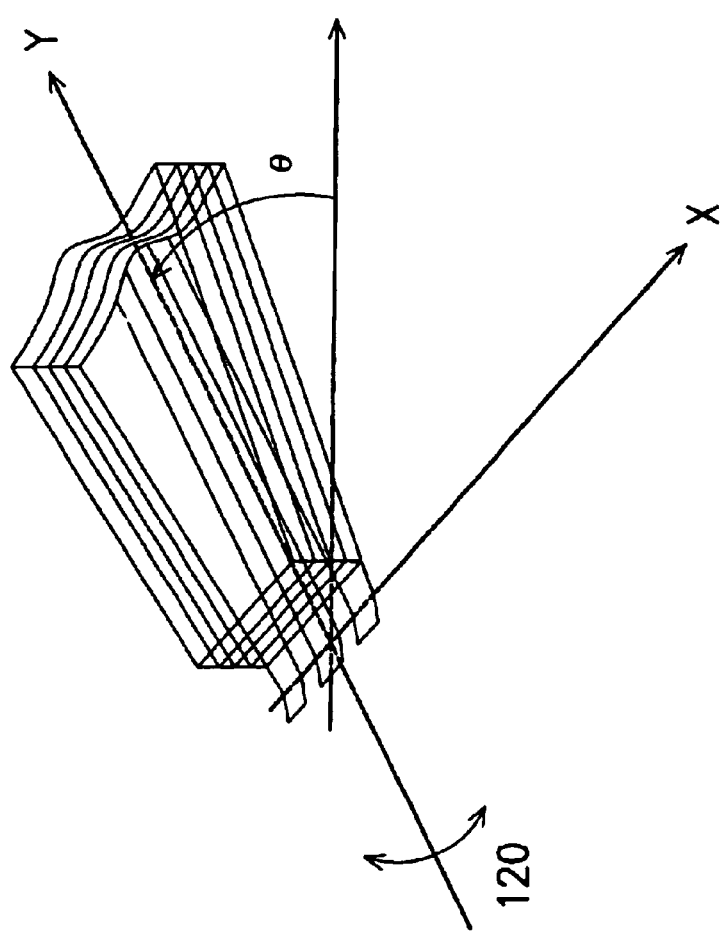
FIG. 2C shows the configuration conformity of the flexible probe by movements of lifting and diving.

FIG. 2A is a display view showing the movements of the flexible probe, while FIGS. 2B and 2C show the configuration conformity of the flexible probe by movements of rotation and lifting-and-diving. The flexibility of the probe 10 results from the structure of the probe including at least the outthrust metal probe tip and the flexible dielectric substrate. Due to the flexibility of the probe 10, the far end (i.e. the metal probe tip 102) opposite to the fixed end 108 allows movements of rotating 110 and lifting-and-diving 120 corresponding to the applied pressure, as shown in FIG. 2A. Through the possible movements of the probe, the configuration of the probe can be adjusted to be more conformal to the tested surface. In FIGS. 2B and 2C respectively, the probe tip allows movements of rotating 110 with an angle ψ and movements of diving and lifting 112 with an angle θ, from the X-Y plane. For example, the rotation angle ψ ranges from about −10 degrees to about +10 degrees, and the angle θ of diving and lifting ranges within about 20 degrees, from the X-Y plane. That is, the flexibility of the probe allows the probe to be slightly bent or twisted while probing the signal from an uneven surface, and also allows a broader range of pressures be applied to the metal probe tip. Such configuration conformity gives the operator great convenience because the object with a certain degree of unevenness can still be tested.

Figure 3:
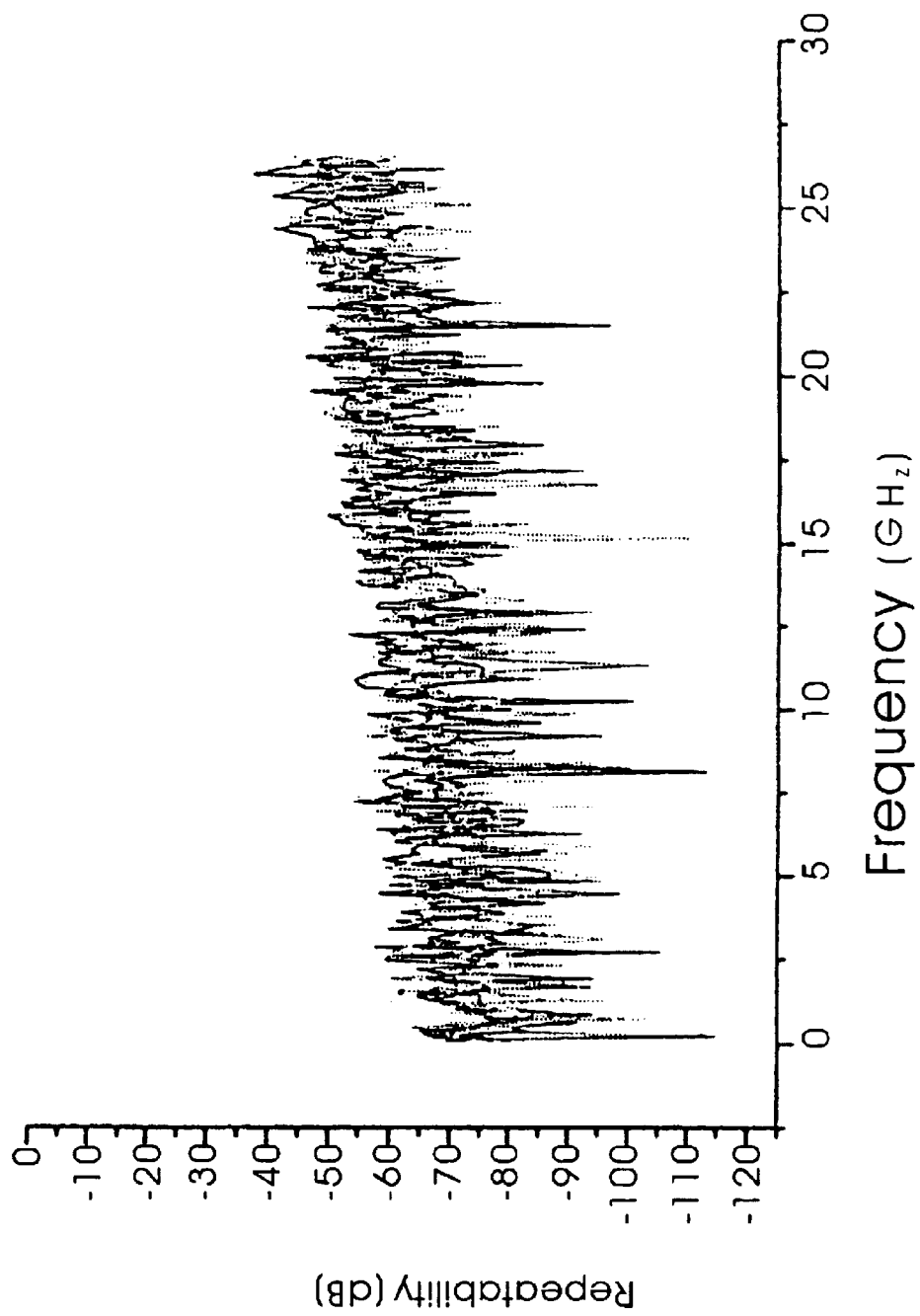
FIG. 3 is a graph showing the contact repeatability vs. frequency, using the flexible probe provided by the present invention for measurement.

Under the same contact state, the flexibility of the probe 10 results in the same applied pressure for any contact angle within a tolerable range, this is the key factor for obtaining the reproducibility and repeatability of the measurement using the probe 10. Referring to FIG. 3, a graph of contact repeatability vs. frequency is shown. The measurement result of FIG. 3 is obtained under a non-tilting state, an arbitrary positive tilting angle and an arbitrary negative tilting angle. The contact repeatability is −40 dB even when frequency is as high as 26.5 GHz (the error is about 0.3%, which is minor error for microwave network measurement).

Figure 4:
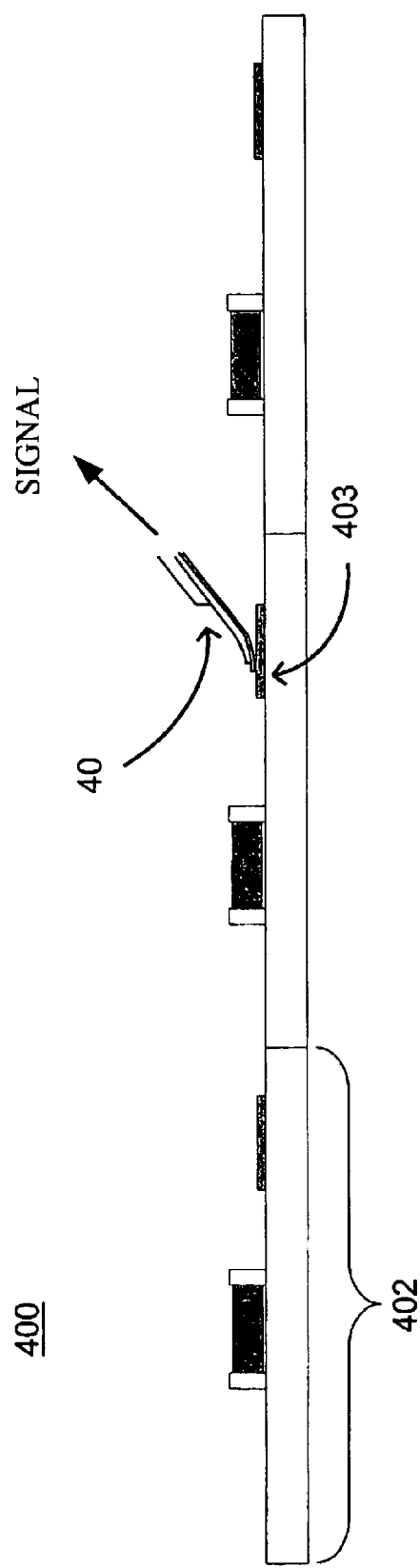
FIG. 4 is a schematic cross-sectional view showing the application of the probe to the measured object.
Figure 5A:
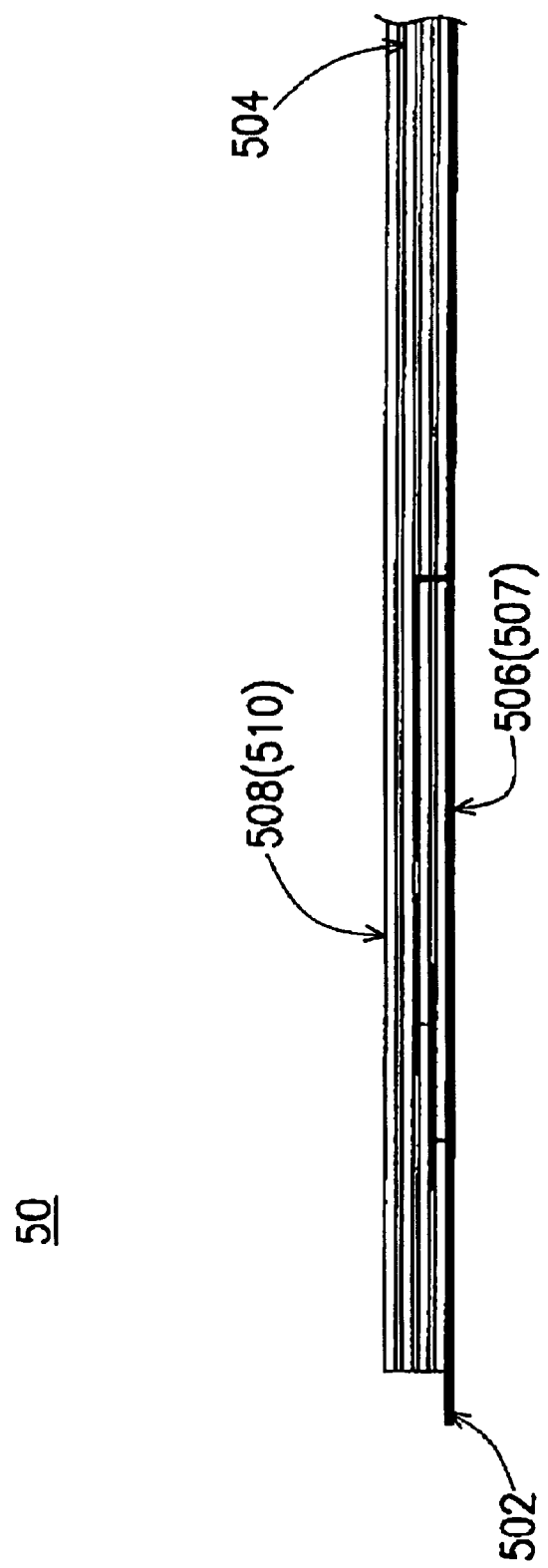
FIG. 5A is a cross-sectional partial view of the flexible probe according to one preferred embodiment of the present invention.
Figure 5B:
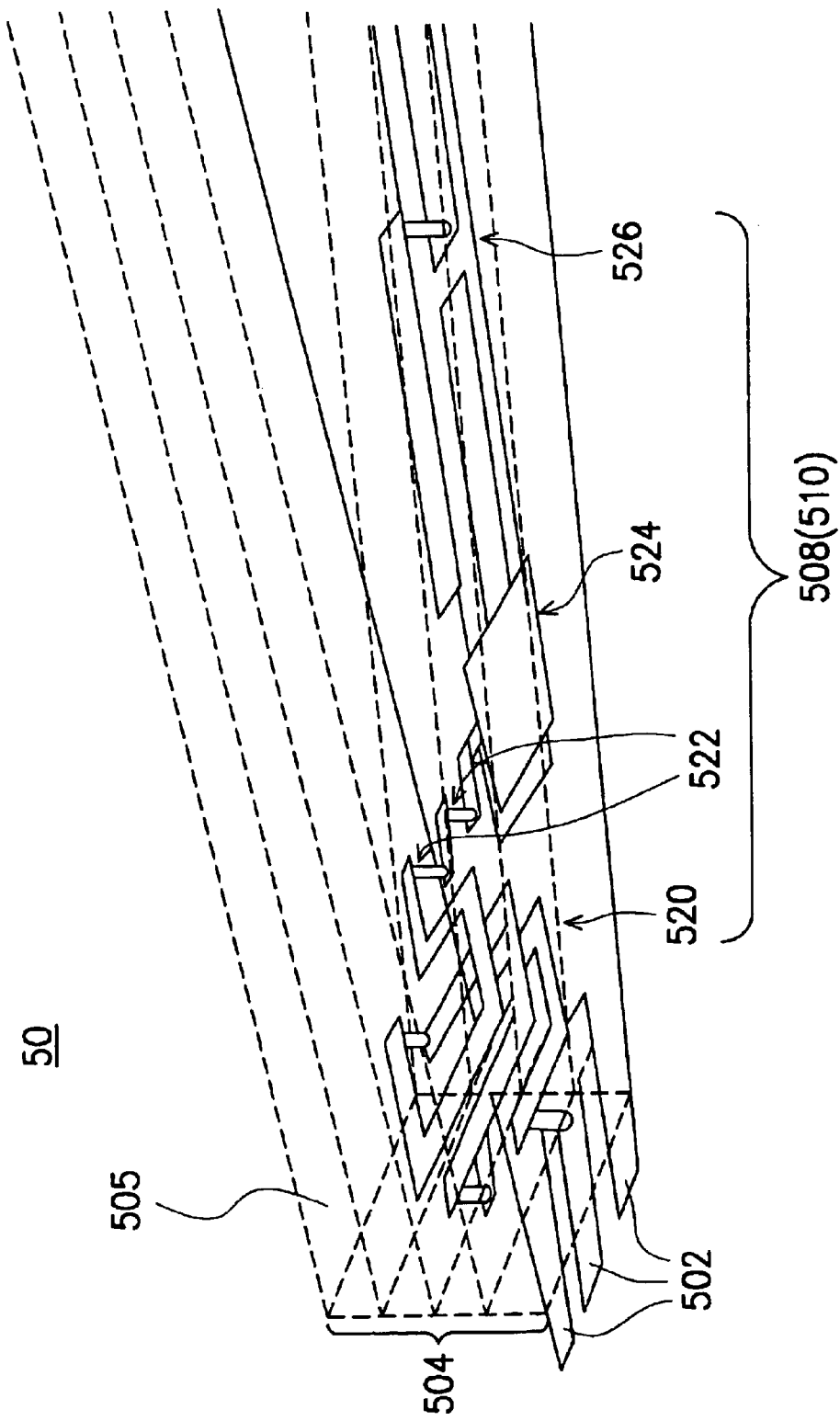
FIG. 5B is a perspective view for a portion of the flexible probe in FIG. 4A.

The probe can be applied in measuring signal from chips, wafers, PCB boards or even micro-electro-mechanical system (MEMS). Taking the board level measurement as an example, the probe is suitable to be applied to testing modules on the printed circuit board (PCB). As shown in FIG. 4, the probe 40 is applied to the PCB board 400 with an uneven surface. The PCB board 400 includes a plurality of microwave module plates 402, pre-cut but not divided, while the module plate 402 includes at least a test pad 403. The flexible probe 40 can be applied to the test pad of the board for measuring signals. Compared with the prior technology, the flexible probe in this invention can be used for non-coplanar measurement FIG. 5A shows the partial cross-sectional view of the flexible probe. In FIG. 5A, the probe 50 includes a probe tip 502, a planar transmission structure 506 connected to the probe tip, and a multi-layered dielectric substrate 504 (only a portion is shown). As shown in FIG. 5B, the multi-layered dielectric substrate 504 can be a stacked structure of multiple flexible dielectric material layers 505, and the flexible dielectric material can be polyimide, for example. Preferably, the flexible dielectric material has a Young's modulus of about 2–5 GPa. The probe tip 502 is connected to the planar transmission structure 506, but not directly joined to the dielectric substrate 504. The probe tip 502 extends outward and freely suspends from the planar transmission structure 506 into the surrounding air, while the planar transmission structure 506 is attached to and supported by the multi-layered dielectric substrate 504. Alternatively, the planar transmission structure 506 can be replaced with a connector 507. Depending on the design requirements of probe, devices 508 or a multi-layered circuit 510 could be embedded into the multi-layered dielectric substrate 506. The multi-layered circuit 510 can be a multi-layered microwave circuit, a signal transmission circuit, an impedance matching/transferring network, a bias circuit or even an active device circuit, for example, comprising of different devices 508 embedded between different dielectric material layers. The device 508, as shown in FIG. 5B, can be an inductor 520, vertical connectors 522, a capacitor (or matching circuit device) 524 and a coupler 526. These devices or the circuit embedded within the multi-layered dielectric substrate 506 can provide particular functions, including impedance matching, impedance transferring, signal coupling and bias network for the power supply of the tested object. By installing certain devices into the multi-layered dielectric substrate, the probe can be designed as an impedance pre-matching type of probe with a bias network for measuring the non-system impedance matching device or module. In addition, the probe can be designed as a mixer type probe to analyze and measure the hybrid type chip or vector network on the module substrate.

Accordingly, the flexible probe provided by the present invention can provide higher accuracy and repeatability, and is suitable to be applied to measure the object with an uneven surface or with lower surrounding planarity. In addition, the flexible probe of the invention is particularly applicable for the microwave measurement and the high-speed signal measurement. The advantages of the flexible probe at least include better configuration conformity, broader ranges for pressure application of the probe and superior durability.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A flexible probe for measuring a signal, the probe comprising:
    a metal probe tip for measuring the signal;
    a flexible dielectric substrate;
    a planar transmission structure, connected to the metal probe tip and attached onto the multi-layered dielectric substrate, wherein the metal probe tip extends out from the planar transmission structure without being joined to the multi-layered dielectric substrate;
    a coaxial transmission structure, connected to the planar transmission structure, wherein the signal measured by the probe tip is transmitted through the planar transmission structure to the coaxial transmission structure; and
    a fixed end, coupled to the multi-layered dielectric substrate and the planar transmission structure;
    wherein the metal probe tip is able to rotate around an axis with a first angle.

2. The flexible probe according to claim 1, wherein a material of the dielectric substrate has a Young's modulus of about 1–10 GPa.

3. The flexible probe according to claim 1, wherein the flexible dielectric substrate is a multi-layered dielectric substrate and at least a device is further embedded within the flexible dielectric substrate.

4. The flexible probe according to claim 3, wherein the device is selected from the group consisting of a vertical connector, and a coupler.

5. The flexible probe according to claim 1, wherein the flexible dielectric substrate is a multi-layered dielectric substrate and at least a multi-layered circuit is further embedded within the flexible dielectric substrate.

6. The flexible probe according to claim 1, wherein the fixed end supports and holds the probe and functions as a transition between the planar transmission structure and the coaxial transmission structure.

7. The flexible probe according to claim 1, wherein the planar transmission structure and the metal probe tip are an integral and indivisible structure.

8. The flexible probe according to claim 1, wherein the signal is a microwave signal.

9. The flexible probe according to claim 1, wherein the signal is an on-wafer signal.

10. The flexible probe according to claim 1, wherein the signal is a signal of a printed circuit board.

11. A flexible probe for measuring a signal, the probe comprising:
    a metal probe tip for measuring the signal;
    a flexible dielectric substrate;
    a planar transmission structure, connected to the metal probe tip and attached onto the multi-layered dielectric substrate, wherein the metal probe tip extends out from the planar transmission structure without being joined to the multi-layered dielectric substrate;
    a coaxial transmission structure, connected to the planar transmission structure, wherein the signal measured by the probe tip is transmitted through the planar transmission structure to the coaxial transmission structure; and
    a fixed end, coupled to the multi-layered dielectric substrate and the planar transmission structure;
    wherein the metal probe tip is able to lift and dive with a second angle.

12. The flexible probe according to claim 11, wherein a material of the dielectric substrate has a Young's modulus of about 1–10 GPa.

13. The flexible probe according to claim 11, wherein the flexible dielectric substrate is a multi-layered dielectric substrate and at least a device is further embedded within the flexible dielectric substrate.

14. The flexible probe according to claim 13, wherein the device is selected from the group consisting of a vertical connector and a coupler.

15. The flexible probe according to claim 11, wherein the flexible dielectric substrate is a multi-layered dielectric substrate and at least a multi-layered circuit is further embedded within the flexible dielectric substrate.

16. The flexible probe according to claim 11, wherein the fixed end supports and holds the probe and functions as a transition between the planar transmission structure and the coaxial transmission structure.

17. The flexible probe according to claim 11, wherein the planar transmission structure and the metal probe tip are an integral and indivisible structure.

18. The flexible probe according to claim 11, wherein the signal is a microwave signal.

19. The flexible probe according to claim 11, wherein the signal is an on-wafer signal.

20. The flexible probe according to claim 11, wherein the signal is a signal of a printed circuit board.

* * * * *